(12) United States Patent
Otremba et al.

(10) Patent No.: US 8,815,647 B2
(45) Date of Patent: Aug. 26, 2014

(54) CHIP PACKAGE AND A METHOD FOR MANUFACTURING A CHIP PACKAGE

(75) Inventors: Ralf Otremba, Kaufbeuren (DE); Bernd Roemer, Bernhardswald (DE); Erich Griebl, Dorfen (DE); Fabio Brucchi, Villach (AT)

(73) Assignee: Infineon Technologies AG, Neubiberg (DE)

( * ) Notice: Subject to any disclaimer, the term of this patent is extended or adjusted under 35 U.S.C. 154(b) by 60 days.

(21) Appl. No.: 13/602,349

(22) Filed: Sep. 4, 2012

(65) Prior Publication Data

US 2014/0061669 A1    Mar. 6, 2014

(51) Int. Cl.
*H01L 21/00* (2006.01)
*H01L 23/34* (2006.01)

(52) U.S. Cl.
USPC ............ 438/121; 438/106; 257/687; 257/719

(58) Field of Classification Search
None
See application file for complete search history.

(56) References Cited

U.S. PATENT DOCUMENTS

| 7,271,470 | B1 | 9/2007 | Otremba |
| 7,476,978 | B2 | 1/2009 | Otremba |
| 7,541,681 | B2 | 6/2009 | Otremba |
| 7,663,212 | B2 | 2/2010 | Otremba |
| 7,757,392 | B2 | 7/2010 | Otremba |
| 7,759,777 | B2 | 7/2010 | Otremba et al. |
| 8,044,523 | B2 | 10/2011 | Otremba |
| 2005/0051877 | A1* | 3/2005 | Hsu ............................... 257/667 |
| 2008/0116492 | A1* | 5/2008 | Wu et al. ....................... 257/213 |
| 2009/0227071 | A1* | 9/2009 | Otremba et al. .............. 438/113 |
| 2011/0215470 | A1* | 9/2011 | Chen et al. .................... 257/738 |

FOREIGN PATENT DOCUMENTS

| DE | 102004030042 A1 | 1/2006 |
| DE | 102007019686 A1 | 11/2007 |
| DE | 102007017831 A1 | 10/2008 |

OTHER PUBLICATIONS

English abstract of DE 102007017831 A1.

* cited by examiner

*Primary Examiner* — Julio J Maldonado
*Assistant Examiner* — Joseph Galvin, III

(57) ABSTRACT

A chip package is provided, the chip package including: a carrier including at least one cavity; a chip disposed at least partially within the at least one cavity; at least one intermediate layer disposed over at least one side wall of the chip; wherein the at least one intermediate layer is configured to thermally conduct heat from the chip to the carrier.

24 Claims, 9 Drawing Sheets

CHIP PACKAGE AND A METHOD FOR MANUFACTURING A CHIP PACKAGE

TECHNICAL FIELD

Various embodiments relate generally to a chip package and a method for manufacturing a chip package

BACKGROUND

Today, chips are primarily cooled through the chip back side. For example, as shown in FIG. 5, chip 501 may be connected to chip carrier 503, e.g. the lead frame, via chip solder 505 formed on the chip back side. The chip may be surrounded by organic materials 507, e.g. mold compounds or laminates which electrically insulate the chip and electrical wiring 509 connected to the chip. These traditional organic materials 507 with a poor thermal conductance of approximately 1 W/mK, may provide insufficient power handling, without sufficient heat spreading and/or heat conductance.

SUMMARY

Various embodiments provide a chip package including: a carrier including at least one cavity; a chip disposed at least partially within the at least one cavity; at least one intermediate layer disposed over at least one side wall of the chip; wherein the at least one intermediate layer is configured to thermally conduct heat from the chip to the carrier.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DETAILED DESCRIPTION

Figure 1:
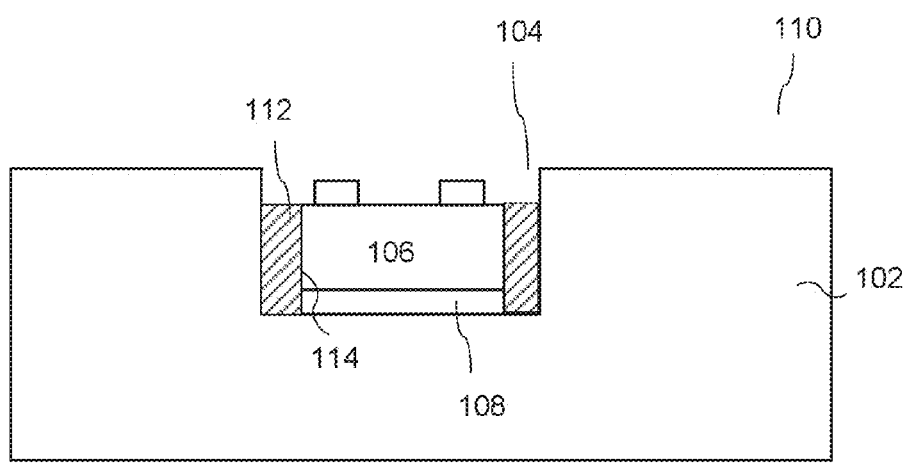
FIG. 1 shows a chip package according to an embodiment.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over", used herein to describe forming a feature, e.g. a layer, "over" a side or surface, may be used to mean that the feature, e.g. the layer may be formed "directly on", e.g. in direct contact with, the implied side or surface. The word "over", used herein to describe forming a feature, e.g. a layer "over" a side or surface, may be used to mean that the feature, e.g. the layer may be formed "indirectly on" the implied side or surface with one or more additional layers being arranged between the implied side or surface and the formed layer.

Organic materials, e.g. mold compounds and/or laminates which surround a chip in a chip package, have a much worse thermal conductance of approximately 1 W/mK than solder materials which may have a thermal conductance of approximately 40 W/mK, and a chip carrier, e.g. a copper lead frame, which may have a thermal conductance of approximately 300 W/mK. Thermal conductance may be understood to refer to thickness divided by the product of thermal resistance and Area, i.e. thermal conductance=thickness/(thermal resistance×Area).

Various embodiments provide a chip package for current and future compact chip technologies, wherein smaller chip surface areas may be expected. These chips, which may include power semiconductor chips, may experience a massive performance limitation, e.g. current and temperature limitations. Therefore, substantial performance limits arise in particular for smaller chip technologies and those with smaller chip areas. In particular, their maximum current, e.g. given by $I^2 max\ current=\Delta Temp\ (K)/(Rth\ (K/W) \times Ron\ (\Omega))$, may be limited, because the maximum temperature of the chip in the application or during operation may be expected to remain constant at approximately 150 to 175° in the future.

Various embodiments provide a three-dimensional (3D) heat spreading, wherein chips may be cooled via the chip back side and the chip side walls.

Various embodiments provide an increase in the available areas for thermal conduction and/or heat dissipation, and may be used for small chips e.g. approximately 1 mm² area chips and/or chips having a thickness ranging from about 100 μm to about 700 μm.

Various embodiments provide 3D heat spreading which may improve chip cooling of power packages, as the extent of cooling may currently be the limiting factor for power electronic components.

Various embodiments provide a chip package, wherein thin chip side walls may be targeted to be used for cooling in power chip packages, by means of a chip carrier cavity, and thermally conductive chip embedding materials, e.g. metals.

Figure 2:
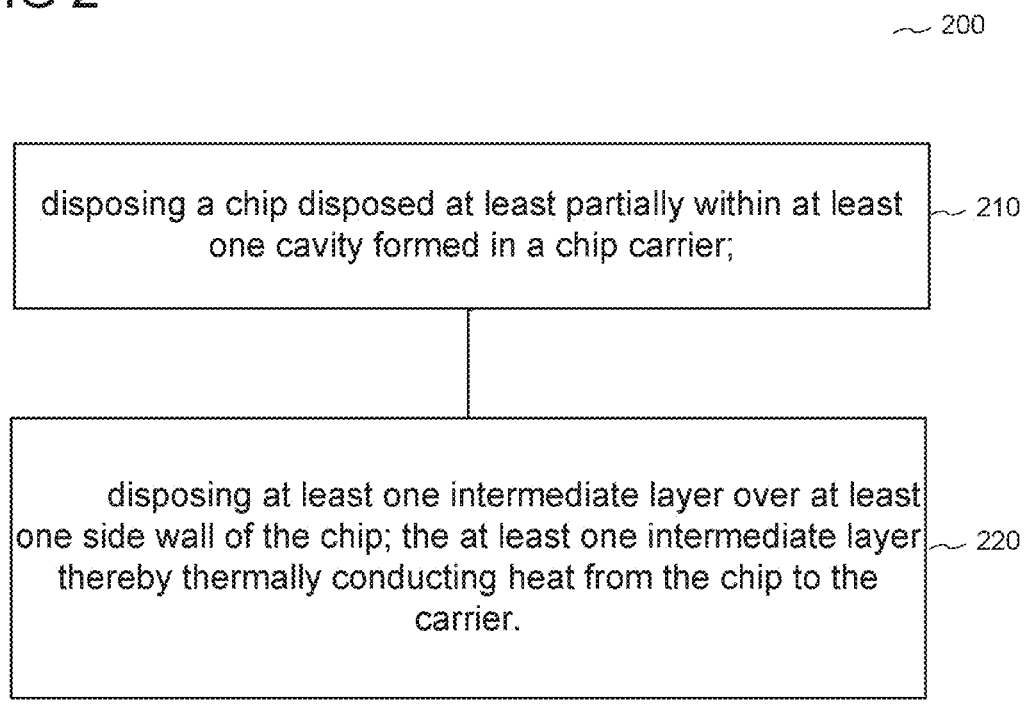
FIG. 2 shows a method for manufacturing a chip package according to an embodiment.

FIG. 2 shows method 200 for manufacturing a chip package according to an embodiment.

Method 200 may include:

disposing a chip disposed at least partially within at least one cavity formed in a chip carrier (in 210);

disposing at least one intermediate layer over at least one side wall of the chip; the at least one intermediate layer thereby thermally conducting heat from the chip to the carrier (in 220).

FIGS. 3A to 3F shows method 300 for manufacturing a chip package according to an embodiment.

Figure 3A:
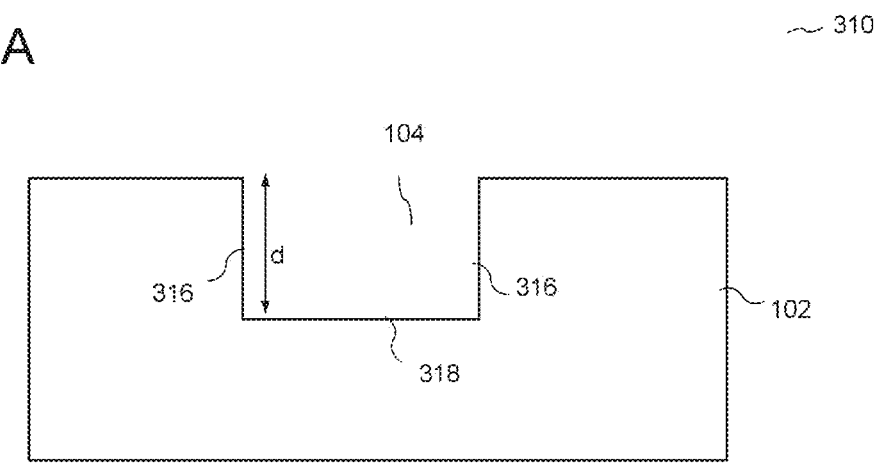
FIGS. 3A to 3F show a method for manufacturing a chip package according to various embodiments.

As shown in FIG. 3A (310), method 300 may include forming at least one cavity 104 in carrier 102.

Carrier 102 may include a lead frame, e.g. a copper lead frame. Carrier 102 may include at least one material from the following group of materials, the group of materials consisting of: copper, nickel, iron, silver, gold, palladium, phosphorous, copper alloy, nickel alloy, iron alloy, silver alloy, gold alloy, palladium alloy, phosphorous alloy. Carrier 102 may include an electrically conductive material.

Cavity 104 may be formed, e.g. by etching and/or e.g. by laser structuring and/or e.g. by mechanical structuring. Cavity 104 may be formed such that cavity 104 has a depth d. Cavity depth d may range from about 100 μm to about 800 μm, but it may be understood that cavity depth d may not be limited to this range of depths, and may be varied according to the depth required for holding a chip and/or chips. For example, cavity depth d may be larger than the thickness Ct of chip 106.

Cavity 104 may include cavity side walls 316 and cavity bottom wall 318, which may be connected and/or joined to cavity side walls 316. Cavity side walls 316 and cavity bottom wall 318 define cavity 104. Cavity 104 may be understood to include a recess formed from carrier top side 315. Cavity depth d may be understood to be the distance measured between carrier top side 315 and cavity bottom wall 318. Cavity side walls 316 may join cavity bottom wall 318 to carrier top side 315.

Figure 3B:
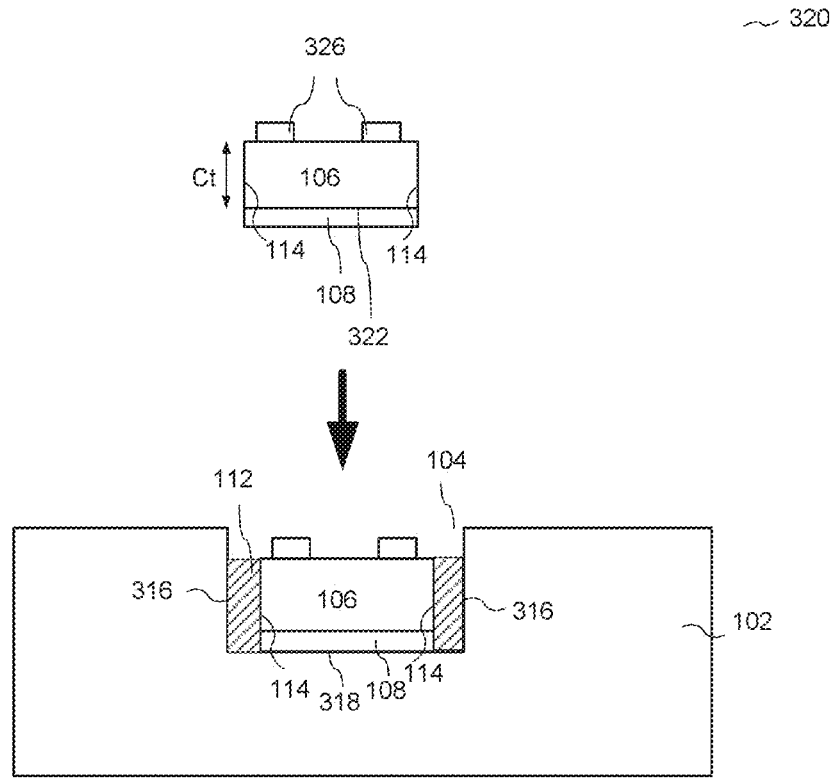

As shown in FIG. 3B (in 320), chip 106 may be disposed at least partially within at least one cavity 104 formed in chip carrier 102.

Chip 106 may include a semiconductor die, which may optionally include at least one contact pad, e.g. chip back side metallization layer 108. Chip back side metallization layer 108 may be formed over and/or directly on chip back side 322. Chip 106 may further include at least one contact pad, e.g. at least one chip front side contact pad 326 formed over and/or directly on chip front side 324. Chip back side metallization layer 108 and/or at least one chip front side contact pad 326 may include at least one material, element or alloy from the following group of materials, the group consisting of: copper, aluminum, silver, tin, titanium, gold, palladium, zinc, nickel, iron.

It may be understood that front side may also be referred to as a "first side", "top side" or "upper side" of the chip. The terms "top side", "first side", "front side" or "upper side" may be used interchangeably hereinafter. Back side may also be referred to as "second side" or "bottom side" of the chip. The terms "second side", "back side", or "bottom side" may be used interchangeably hereinafter.

Chip 106 may include semiconductor power device. As used herein with respect to some semiconductor power devices, the terms "top side", "first side", "front side" or "upper side" may be understood to refer to the side of the chip wherein one or more chip metallization contact pads may be formed, e.g. a gate region, e.g. a first source/drain region may be formed. The terms "second side", "back side", or "bottom side" may be understood to refer to the side of the chip wherein a second source/drain region may be formed. It may be understood that a semiconductor device, e.g. a semiconductor power transistor may support a vertical current flow through the chip between a chip front side contact pad, e.g. 326 and a chip back side contact pad, e.g. a chip back side metallization 108. For example, chip front side contact pad 326 may be supplied with a voltage ranging from about 150 V to about 900 V, and chip back side metallization 108 may connected to a base potential voltage, e.g. ground, e.g. 0 V.

Chip 106 may include semiconductor power device including silicon carbide (SiC). Chip 106 may include a semiconductor power device including gallium nitride (GaN). Chip 106 may include at least one semiconductor power device, e.g. including SiC, GaN, wherein the chip or die may be smaller than typical dies used for silicon devices, for example up to twenty times smaller. For example, chip 106 may have a length (Cl)×breadth (Cb, not shown) surface area ranging from about 0.5 mm$^2$ to 10 mm$^2$ Chip 106 may include a thickness (Ct) ranging from about 100 µm to about 800 µm, e.g. about 200 µm to about 600 µm, e.g. about 300 µm to about 500 µm. Chip 106 may include a semiconductor power device dissipating a power much larger than conventional silicon chips. For example, chip 106 may include a semiconductor power device dissipating a power ranging from about 10 W to 30 W. Cooling from chip back side 322 alone, may not be sufficient to dissipate heat to keep the chip at a suitable temperature range, e.g. less than 150° C.

Chip 106 may be disposed in at least one cavity 104. Chip 106 may be electrically connected to carrier 102, e.g. cavity bottom wall 318, via chip back side metallization layer 108. According to other embodiments, however, chip 106 may not be electrically connected to the carrier. At least one intermediate layer 112 may be disposed over at least one side wall 114 of chip 106. At least one intermediate layer 112 may cover only partially at least one side wall 114 or may substantially fully cover at least one side wall 114. At least one intermediate layer 112 may be electrically connected to chip back side metallization layer 108. At least one intermediate layer 112 may thereby thermally conduct heat from chip 106 to carrier 102. It may be possible that the surface area of at least one side wall (Ct×Cb×n) may be substantially equal to or larger than surface area of chip back side (Cl×Cb), where n is the number of sidewalls, which may typically be four. It may be possible that the surface area of at least one side wall (Ct×Cb×n) may have a surface area ranging from about 40% to 250% of chip back side surface area(Cl×Cb). (For example, a chip with chip back side surface area (Cl×Cb=1×1 mm$^2$), may have a chip thickness of about 200 µm. Chip side wall area with n sidewalls may be Ct×Cb=1×0.2×n mm$^2$, which may be approximately 0.8 mm$^2$ if n=4. Therefore, in this example, chip sidewall area may be approximately 80% of chip back side surface area. Therefore, heat dissipation from the side wall may contribute significantly to cooling of chip 106.

At least one intermediate layer 112 may include a thermal conductance larger than 10 W/mK. At least one intermediate layer 112 may include a metal. Metals may generally have a thermal conductance greater than 300 W/mK, e.g. approximately 400 W/mk. At least one intermediate layer 112 may include at least one material, element or alloy from the following group of materials, the group consisting of: copper, aluminum, silver, tin, titanium, gold, palladium, zinc, nickel, iron.

At least one intermediate layer 112 may include die attach material 328. Die attach material 328 may include a solder material. Solder material may include a solder alloy including at least one material from the following group of materials, the group of materials consisting of: tin, indium, gold, silver, copper, nickel, lead, and antimony, and one or more alloys thereof. For example, the solder material may include a solder based on Sn and/or In, one or both of which may form an alloy with at least one of: Au, Ag, Cu, Ni, Pb or Sb. Solder material may generally have a thermal conductance greater than 50 W/mK At least one intermediate layer 112 may be electrically shorted to chip back side metallization layer 108. It may be understood that whereas traditionally chip back side metallization layer 108 may be formed exclusively on chip back side 322. The back side contact, e.g. chip back side metallization layer 108 may also cover at least one side wall 114. In other words, at least one intermediate layer 112 may be configured as a back side contact like chip back side metallization layer 108 which may be formed over and/or directly on at least one side wall 114 and chip back side 322. Therefore, at least one intermediate layer 112 and chip back side metallization layer 108 may be supplied with the same base potential voltage, e.g. ground voltage, e.g. 0 V. Chip back side metallization layer 108 may be electrically connected to carrier 102. At least one intermediate layer 112 may also electrical connect at least one side wall 114 to carrier 102, e.g. to at least one cavity side wall 316 and to at least one cavity bottom wall 318. Chip back side 322, e.g. chip back side metallization layer 108, and at least one side wall 114 may be connected to carrier 102 via die attach material 328. As a result, carrier 102, chip back side metallization layer 108 and at least one intermediate layer 112 may be supplied with the same base potential voltage, e.g. ground voltage, e.g. 0 V.

At least one intermediate layer 112 may be configured to thermally conduct heat from at least one side wall 114 to at least one cavity side wall 316. At least one intermediate layer 112 may increase the total surface area of chip 106 in thermal contact with carrier 102.

Figure 3C:
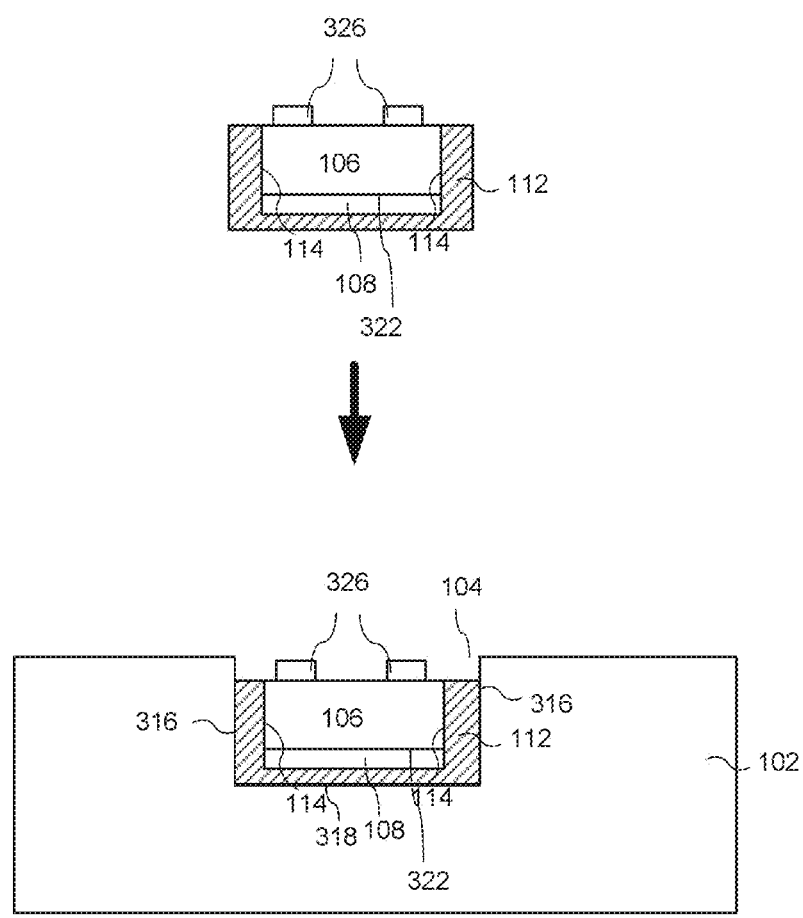
Figure 3D:
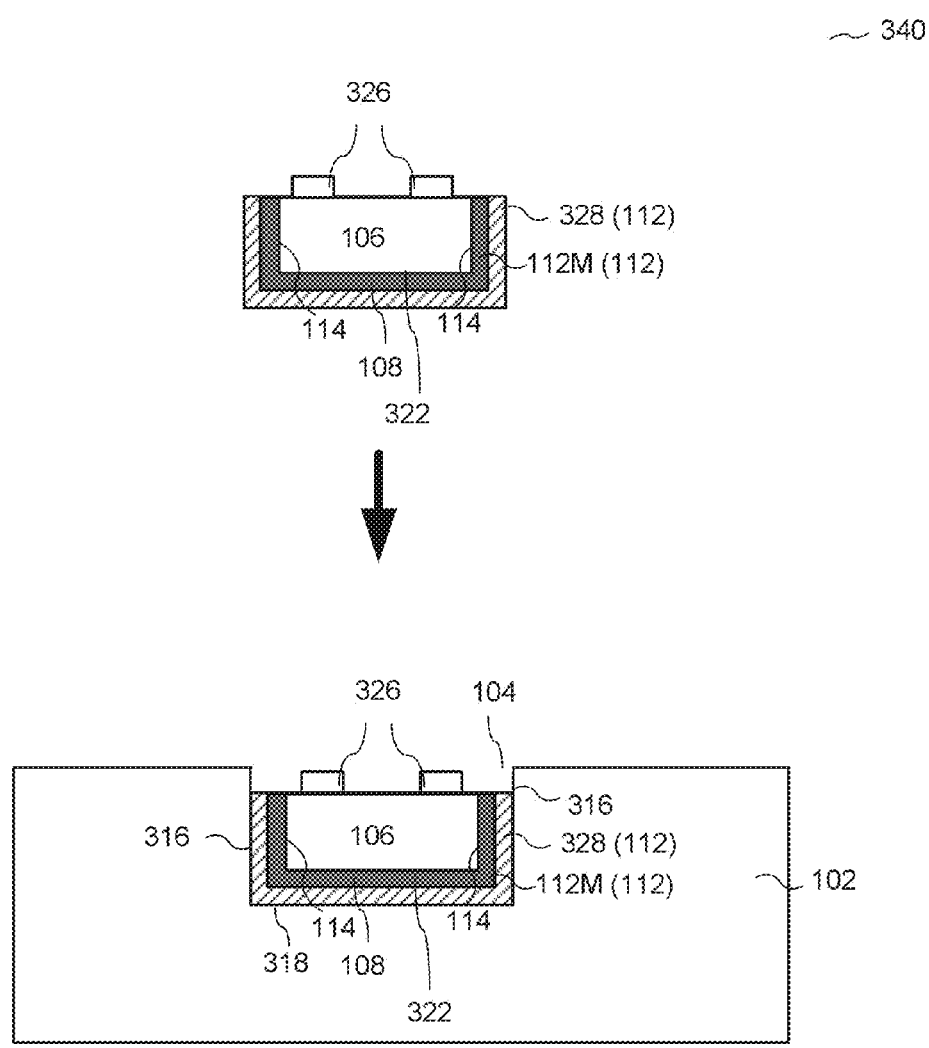
Figure 3E:
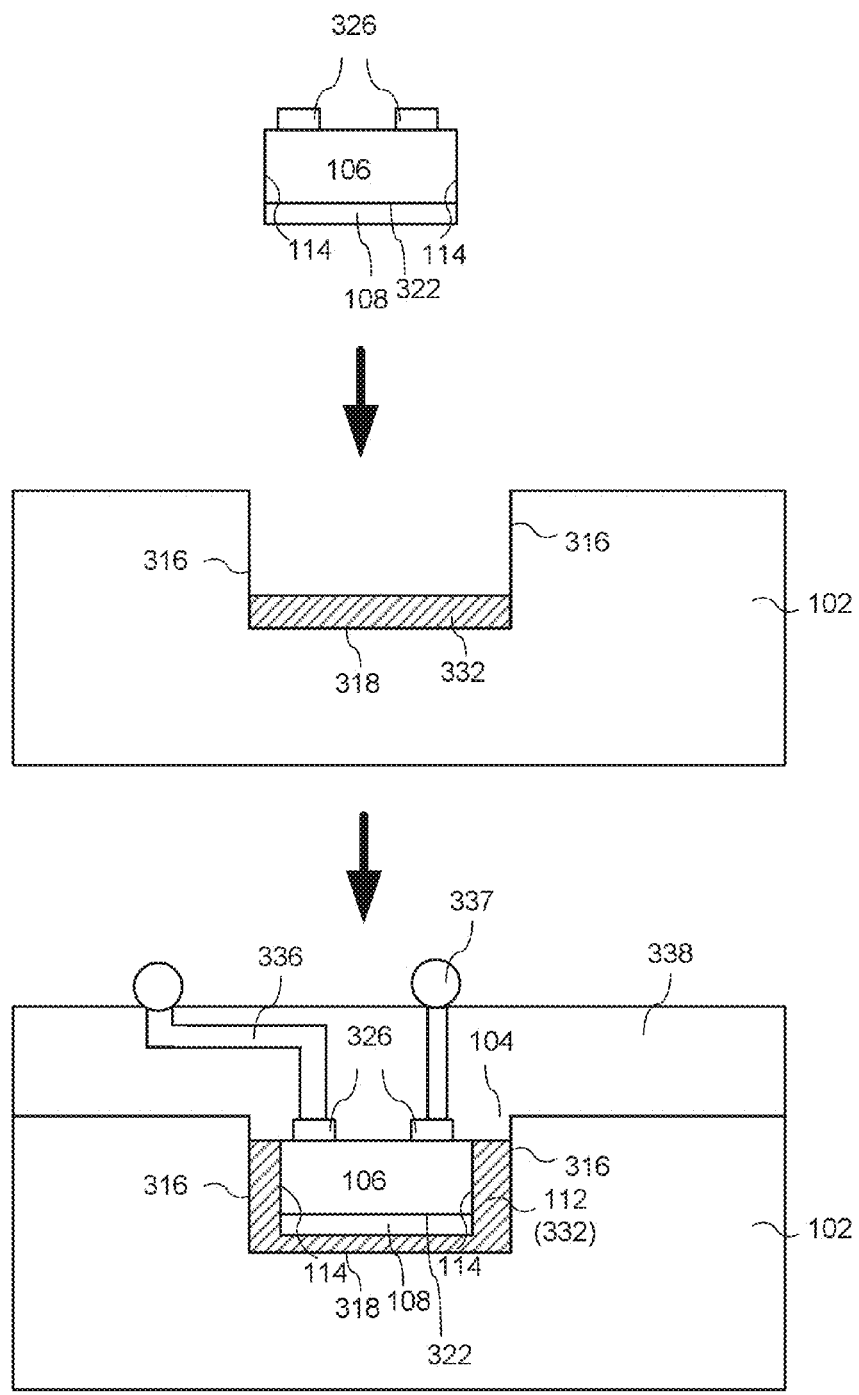

FIGS. 3C to 3E show processes for forming at least one intermediate layer 112 according to various embodiments.

According to an embodiment as shown in FIG. 3C (330), at least one intermediate layer 112 may be deposited over at least one side wall 114 and over chip back side metallization layer 108. At least one intermediate layer 112 may include a die attach material 328, e.g. a solder material, e.g. a solder alloy. In this case, at least one intermediate layer 112 may be deposited by at least one deposition process from the following group of deposition processes, the group of deposition processes consisting of: evaporation, sputtering, galvanic plating. It may be understood, that at least one intermediate layer 112 may function as a die attach material for chip back side 322 and at least one chip side wall 114. It may further be understood, that as at least one intermediate layer 112 may be formed over both at least one side wall and chip back side 322, at least one side wall and chip back side 322 may be electrically shorted, e.g. may be configured to supply a chip with the same potential voltage. After chip 106 may be disposed at least partially within cavity 104, at least one side wall 114 and chip back side metallization layer 108 may be soldered to carrier 102 via at least one intermediate layer 112 in the form of a solder material, e.g. die attach material 328. The soldering process may include, e.g. a diffusion soldering process. At least one intermediate layer 112 may be formed over at least one side wall 114 of chip 102 and/or over chip back side 322, e.g. over chip back side metallization layer 108, in a front end process, e.g. a front end of line (FEOL) process.

According to another embodiment as shown in FIG. 3D (340), forming at least one intermediate layer 112 may include forming first metal layer 112M over chip back side 322 and at least one side wall 114, and forming die attach layer 328 over first metal layer 112M.

First metal layer 112M may form at least part of chip back side metallization layer 108. In other words, first metal layer 112M and chip back side metallization layer 108 may form a single continuous electrode formed over chip back side 322 and at least one side wall 114. Die attach layer 328 may also electrically connect chip back side 322 and at least one side wall 114 to carrier 102, and may further function as a joining material, e.g. a solder material, for joining chip back side 322 and at least one side wall 114 to carrier 102. Both first metal layer 112M and die attach layer 328 may be formed deposited during a front end process. At least one side wall 114 and chip back side metallization layer 108 may be soldered to carrier 102 via at least one intermediate layer 112 in the form of a solder material, e.g. die attach material 328.

According to another embodiment as shown in FIG. 3E (350), instead of depositing die attach material 328 over chip back side 322 and at least one side wall 114, e.g. during front end processing, it may be possible to deposit solder material 332 in cavity 104. Solder material 332 may be analogous to die attach material 328, and may be deposited in cavity 104, e.g. over cavity bottom wall 318, using deposition methods such as sputtering or evaporation or galvanic plating. Solder material 332 may be formed over cavity bottom wall 318. Chip 106 may be disposed over cavity bottom wall 318, e.g. over solder material 332, with chip back side 322 and/or chip back side metallization layer 108 on, e.g. electrically contacting, solder material 332. A heating process, e.g. a soldering process, may cause squeeze out of solder material 332 from between chip back side 322 and cavity bottom wall 318 onto at least one side wall 114. As a result, the squeeze out of solder material 332 may form at least one intermediate layer 112 disposed over at least one side wall 114 of chip 106 and electrically connected to chip back side metallization layer 108.

Figure 3F:
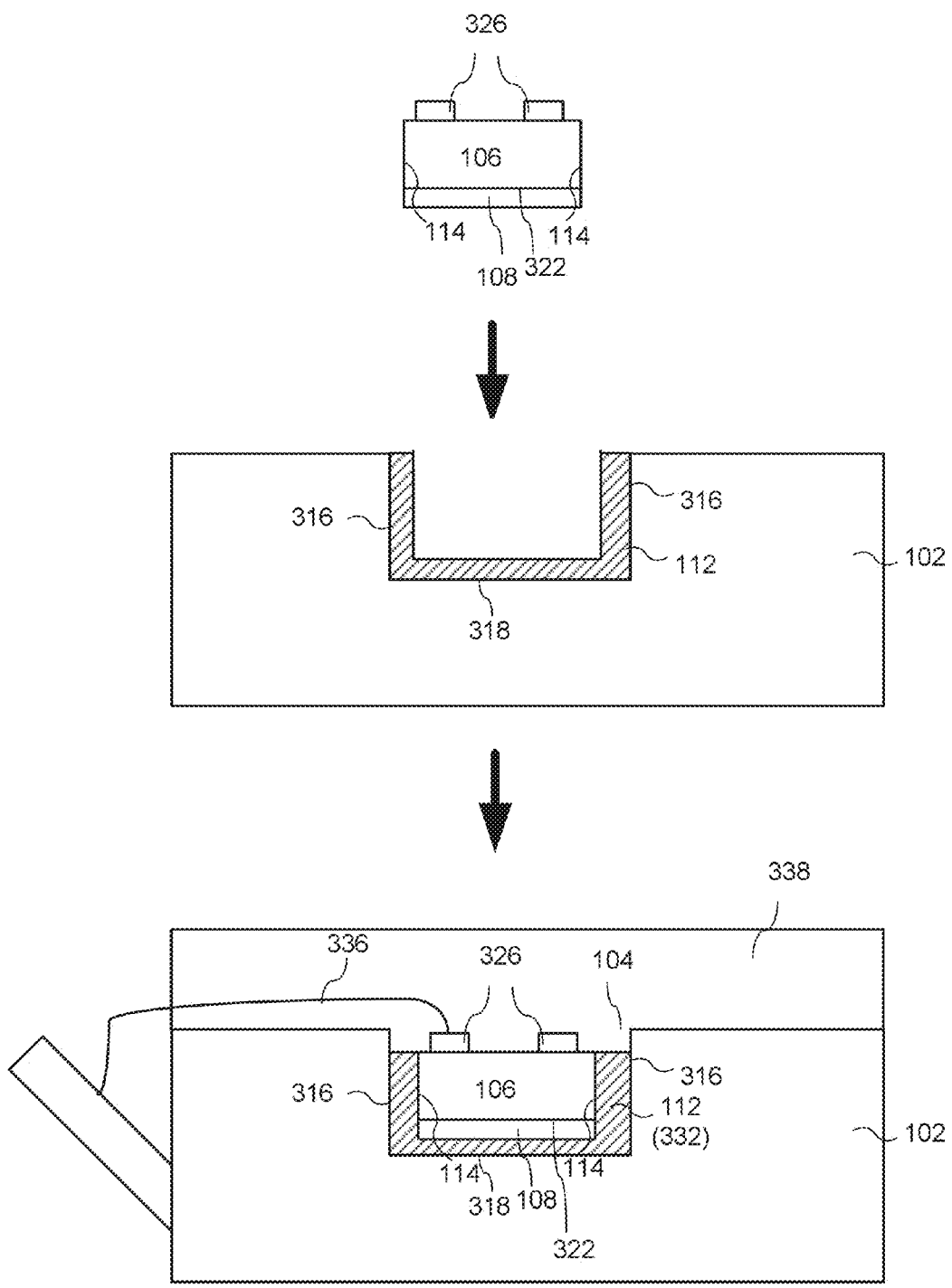

According to another embodiment as shown in FIG. 3F (360), at least one intermediate layer 112 may be deposited over cavity bottom wall 318 and at least one cavity side wall 316, e.g. by galvanic plating using a seed layer. At least one intermediate layer 112 may include die attach material 328 as previously described, e.g. a solder material. Chip 106 may be disposed within cavity 104, and joined, e.g. soldered to cavity 104 via at least one intermediate layer 112. At least one chip side wall 114 may be thermally connected to carrier 102 via at least one cavity side wall 316 and at least one intermediate layer 112. At least one chip back side metallization layer 108 may be thermally connected to carrier 102 via at least at least one intermediate layer 112 and cavity bottom wall 318.

According to another embodiment, at least one intermediate layer 112 may include an intermediate via and/or a pillar (not shown) formed in a gap between at least one chip side wall 114 and cavity side wall 316. Intermediate via and/or a pillar may include similar materials to those described with respect to at least one intermediate layer 112, and may thermally and/or electrically connect at least one side wall 114 to cavity side wall 316, for example with a thermal conductance larger than 10 W/mK. According to other embodiments, an intermediate via and/or a pillar may include a filler material, e.g. nanotubes, e.g. nanowires, e.g. nanoparticles deposited in a gap between at least one chip side wall 114 and cavity side wall 316. For example, using gap filling methods and/or for example using growth methods, e.g. chemical vapor deposition. At least one intermediate layer 112 may include a filler material having a thermal conductance larger than 10 W/mK.

Following deposition of at least one intermediate layer 112 over at least one side wall 114 by at least one of the processes shown in FIG. 3C, 3D, 3E or 3F, and following joining and/or adhering of chip 106 to carrier 102 via cavity bottom wall 318, cavity side wall 316 and at least one intermediate layer 112, method 300 may further include wiring and electrically insulating processes. These wiring and electrically insulating processes may be carried out over chip top side 324. At least one electrical interconnect 336 may be electrically connected to at least one chip top side contact pad 326. At least one electrical interconnect 336 may include at least one material, element or alloy from the following group of materials, the group consisting of: copper, aluminum, silver, tin, titanium, gold, palladium, zinc, nickel, iron.

According to some embodiments as shown in FIG. 3F, at least one electrical interconnect 336 may include an electrically conductive wire, e.g. which may be wire bonded to at least one chip top side contact pad 326. Subsequently, electrically insulating material 338, e.g. mold compound and/or e.g. laminate may be formed over chip top side 324 and surrounding and/or electrically insulating at least one electrically interconnect 336. At least one electrical interconnect 336 may be electrically connected to at least part of an electrically conductive lead frame. Although, electrical wiring, using wire bonding is shown in in FIG. 3F, it may be understood that electrical wiring and electrical insulation may be applied to any of the embodiments as shown according to FIGS. 3B to 3F and FIG. 4.

According to another embodiment as shown in FIG. 3E, at least one electrical interconnect 336 may include electrically conductive material deposited over at least one chip top side contact pad 326. For example, electrically insulating material 338 may be deposited over chip top side 324. At least one hole may be formed in electrically insulating material 338 over at least one chip top side contact pad 326, thereby exposing the at least one chip top side contact pad 326. At least one electrical interconnect 336 may be formed in the at least one hole, wherein at least one electrical interconnect 336 may be electrically connected to at least one chip top side contact pad 326. At least one electrical interconnect 336 may be formed by galvanic plating and/or sputtering and/or evaporation. At least one electrical interconnect 336 may further include at least one redistribution layer for electrically connect at least one chip top side contact pad 326 to a joining structure 337, e.g. a solder structure, e.g. a solder ball. Although, electrical wiring, using deposited interconnects is shown in in FIG. 3E, it may be understood that electrical wiring and electrical insulation may be applied to any of the embodiments as shown according to FIGS. 3B to 3F and FIG. 4.

Figure 4:
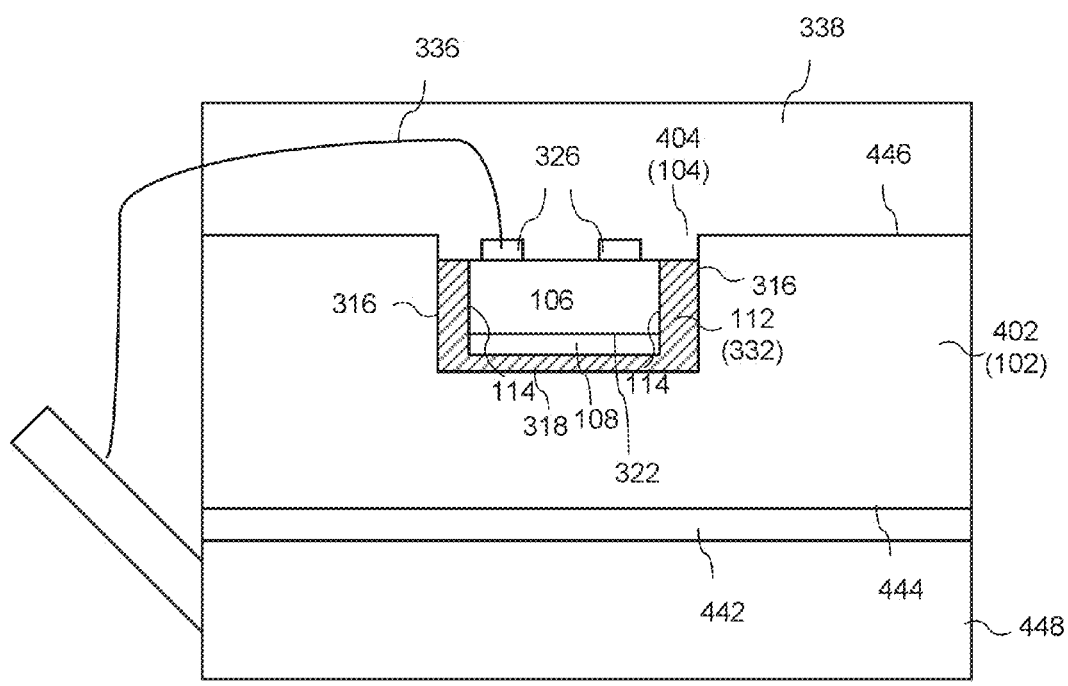
FIG. 4 shows a chip package according to an embodiment
Figure 5:
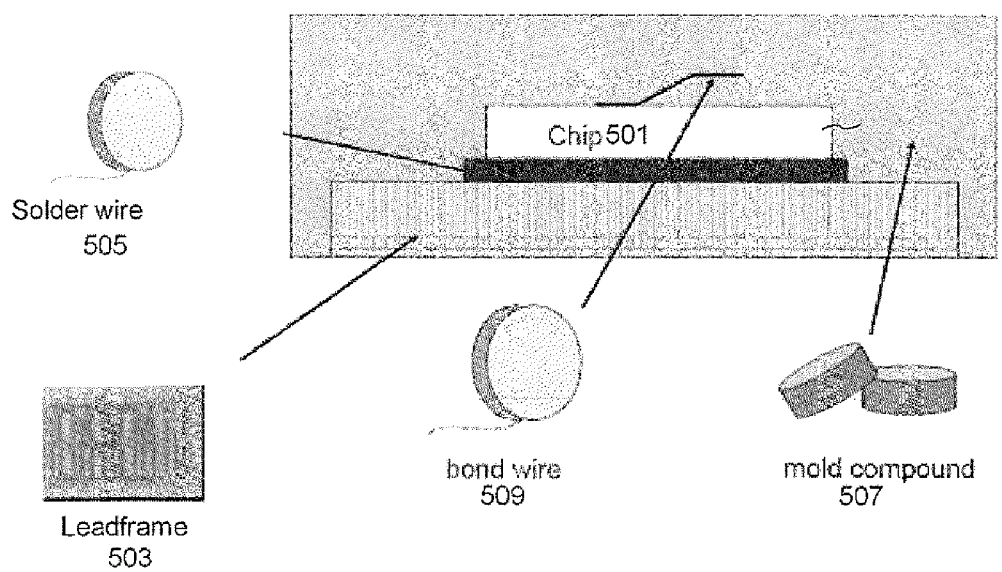
FIG. 5 shows a chip package.

FIG. 4 shows chip package 410 according to an embodiment. Chip package 410 may include one or more or all of the features already described with respect to FIGS. 3A to 3F. With the exception that carrier 102 may include a direct copper bonded substrate 402. Direct copper bonded substrate 402 may include a ceramic material, e.g. $Al_2O_3$, which may have good thermal properties. Direct copper bonded substrate 402 may include ceramic substrate 441 and a copper layer 442 bonded and/or fused to first side 444 of ceramic substrate 402. Furthermore, further copper layer 412 may be bonded and/or fused to second side 446 of ceramic substrate 441. Ceramic substrate 402 may include at least one cavity 404 (analogous to 104) formed in ceramic substrate 402. Further copper layer 412 may be formed in cavity 404, e.g. lining cavity bottom wall 418 (analogous to 318) and at least one cavity side wall 416 (analogous to 316). At least one intermediate layer 112 may include further copper layer 412. In other words, further copper layer 412 may be analogous to at least one intermediate layer 112. At least one intermediate layer 112 may be bonded and/or fused to ceramic material, e.g. ceramic substrate 402. Chip 106 may be disposed at least partially within cavity 404 as described according to previous embodiments, and electrically connected to carrier 102 via chip back side metallization layer 108. Chip back side 322 and at least one side wall 114 may be connected to carrier 102 via further copper layer 412. Further copper layer 412 may be disposed over at least one side wall 114 of chip 106 and electrically connected to chip back side metallization layer 108; wherein further copper layer 412 may be configured to thermally conduct heat from chip 106 to carrier 102. If necessary, a solder material, e.g. die attach material 328, may be deposited over further copper layer 412, wherein die attach material 328 may electrically connect and thermally connected chip back side metallization layer 108 and at least one side wall 114 to carrier 102, and wherein die attach material 328 may furthermore adhere chip back side 322 and at least one side wall 114 to carrier 102, e.g. by soldering. Direct copper bonded substrate 402 may be formed over further carrier 448, which may include a further lead frame. Direct copper bonded substrate 402 may be electrically connected and/or thermally connected to further carrier 338 via copper layer 442.

Various embodiments provide a chip package including: a carrier including at least one cavity; a chip disposed at least partially within the at least one cavity and electrically connected to the carrier via a chip back side metallization layer; at least one intermediate layer disposed over at least one side wall of the chip; wherein the at least one intermediate layer is configured to thermally conduct heat from the chip to the carrier.

According to an embodiment, the at least one intermediate layer is electrically connected to the chip back side metallization layer.

According to an embodiment, the carrier includes a lead frame.

According to an embodiment, the carrier includes at least one material from the following group of materials, the group of materials consisting of: copper, nickel, iron, silver, gold, palladium, phosphorous, copper alloy, nickel alloy, iron alloy, silver alloy, gold alloy, palladium alloy, phosphorous alloy.

According to an embodiment, a surface area of the at least one side wall is substantially equal to or larger than a surface area of the chip back side.

According to an embodiment, the chip includes semiconductor power device including at least one of silicon carbide and gallium nitride.

According to an embodiment, the chip includes a semiconductor power device dissipating a power ranging from about 10 W to 30 W.

According to an embodiment, the chip includes a thickness ranging from about 100 μm to about 800 μm.

According to an embodiment, the at least one intermediate layer includes a metal.

According to an embodiment, the at least one intermediate layer includes at least one material, element or alloy from the following group of materials, the group consisting of: copper, aluminum, silver, tin, titanium, gold, palladium, zinc, nickel, iron.

According to an embodiment, the at least one intermediate layer includes a die attach material, the die attach material including a solder material.

According to an embodiment, the solder material includes a solder alloy including at least one material from the following group of materials, the group of materials consisting of: tin, indium, gold, silver, copper, nickel, lead, and antimony, and one or more alloys thereof.

According to an embodiment, the at least one side wall is soldered to the carrier via the solder material.

According to an embodiment, the die attach material is further formed over the chip back side, wherein the chip back side and the at least one side wall are soldered to the carrier via the die attach material.

According to an embodiment, the at least one intermediate layer includes a thermal conductance larger than 10 W/mK.

According to an embodiment, the at least one intermediate layer is electrically shorted to a chip back side metallization layer.

According to an embodiment, the at least one intermediate layer includes a first metal layer formed over the chip back side and the at least one side wall, wherein the first layer forms at least part of the chip back side metallization layer; and a die attach layer formed over the first metal layer, wherein the die attach layer electrically connects the chip back side and the at least one side wall to the carrier.

According to an embodiment, the at least one intermediate layer is configured to thermally conduct heat from the at least one side wall to at least one cavity side wall.

According to an embodiment, the at least one intermediate layer electrical connects the at least one side wall to the carrier.

According to an embodiment, the carrier includes a ceramic material; and
  wherein the at least one intermediate layer includes a copper layer bonded to the ceramic material; wherein the chip back side and the at least one side wall is connected to the carrier via the copper layer.

Various embodiments provide a method for manufacturing a chip package, the method including: disposing a chip disposed at least partially within at least one cavity formed in a chip carrier and electrically connecting the chip to the carrier via a chip back side metallization layer; disposing at least one intermediate layer over at least one side wall of the chip; the at least one intermediate layer thereby thermally conducting heat from the chip to the carrier.

According to an embodiment, disposing the at least one intermediate layer over the at least one side wall of the chip includes disposing the at least one intermediate layer in a front end process.

According to an embodiment, disposing at least one intermediate layer over the at least one side wall of the chip includes disposing a die attach material over the chip back side and the at least one side wall, wherein the chip back side and the at least one side wall are connected to the carrier via the die attach material.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A chip package comprising;
a carrier comprising at least one cavity;
a chip disposed at least partially within the at least one cavity;
at least one intermediate layer disposed over at least one side wall of the chip;
wherein the at least one intermediate layer is configured to thermally conduct heat from the chip to the carrier,
wherein the at least one intermediate layer comprises
a first metal layer formed over a chip back side and the at least one side wall,
wherein the first metal layer forms at least part of a chip back side metallization layer; and
a die attach layer formed over the first metal layer, wherein the die attach layer electrically connects the chip back side and the at least one side wall to the carrier.

2. The chip package according to claim 1,
wherein the chip is electrically connected to the carrier via a the chip back side metallization layer.

3. The chip package according to claim 2,
wherein the at least one intermediate layer is electrically connected to the chip back side metallization layer.

4. The chip package according to claim 1,
wherein the carrier comprises a lead frame.

5. The chip package according to claim 1,
wherein the carrier comprises at least one material from the following group of materials, the group of materials consisting of: copper, nickel, iron, silver, gold, palladium, phosphorous, copper alloy, nickel alloy, iron alloy, silver alloy, gold alloy, palladium alloy, phosphorous alloy.

6. The chip package according to claim 1,
wherein a surface area of the at least one side wall is substantially equal to or larger than a surface area of the chip back side.

7. The chip package according to claim 1,
wherein the chip comprises semiconductor power device comprising at least one of silicon carbide and gallium nitride.

8. The chip package according to claim 1,
wherein the chip comprises a semiconductor power device dissipating a power ranging from about 10 W to 30 W.

9. The chip package according to claim 1,
wherein the chip comprises a thickness ranging from about 100 µm to about 800 µm.

10. The chip package according to claim 1,
wherein the at least one intermediate layer comprises a metal.

11. The chip package according to claim 1,
wherein the at least one intermediate layer comprises at least one material, element or alloy from the following group of materials, the group consisting of:
copper, aluminum, silver, tin, titanium, gold, palladium, zinc, nickel, iron.

12. The chip package according to claim 1,
wherein the at least one intermediate layer comprises a die attach material, the die attach material comprising a solder material.

13. The chip package according to claim 12,
wherein the solder material comprises a solder alloy comprising at least one material from the following group of materials, the group of materials consisting of: tin, indium, gold, silver, copper, nickel, lead, and antimony, and one or more alloys thereof.

14. The chip package according to claim 12,
wherein the at least one side wall is soldered to the carrier via the solder material.

15. The chip package according to claim 12,
wherein the die attach material is further formed over the chip back side, wherein the chip back side and the at least one side wall are soldered to the carrier via the die attach material.

16. The chip package according to claim 1,
wherein the at least one intermediate layer comprises a thermal conductance larger than 10 W/mK.

17. The chip package according to claim 1,
wherein the at least one intermediate layer is electrically shorted to a the chip back side metallization layer.

18. The chip package according to claim 1,
wherein the at least one intermediate layer is configured to thermally conduct heat from the at least one side wall to at least one cavity side wall.

19. The chip package according to claim 1,
wherein the at least one intermediate layer electrically connects the at least one side wall to the carrier.

20. The chip package according to claim 1,
wherein the carrier comprises a ceramic material; and
wherein the at least one intermediate layer comprises a copper layer bonded to the ceramic material;
wherein the chip back side and the at least one side wall is connected to the carrier via the copper layer.

21. A method for manufacturing a chip package, the method comprising:
disposing a chip at least partially within at least one cavity formed in a chip carrier;
disposing at least one intermediate layer over at least one side wall of the chip; the at least one intermediate layer thereby thermally conducting heat from the chip to the carrier wherein the at least one intermediate layer comprises a first metal layer formed over the chip back side and the at least one side wall, wherein the first layer forms at least part of a chip back side metallization layer; and a die attach layer formed over the first metal layer, wherein the die attach layer electrically connects the chip back side and the at least one side wall to the carrier.

22. The method according to claim 21, wherein disposing the at least one intermediate layer over the at least one side wall of the chip comprises disposing the at least one intermediate layer in a front end process.

23. The method according to claim 21, wherein disposing at least one intermediate layer over the at least one side wall of the chip comprises disposing a die attach material over the chip back side and the at least one side wall, wherein the chip back side and the at least one side wall are connected to the carrier via the die attach material.

24. The method according to claim 21, further comprising electrically connecting the chip to the carrier via a chip back side metallization layer; and electrically connecting the at least one intermediate layer to the chip back side metallization layer.

\* \* \* \* \*